(12) United States Patent
Fukase et al.

(10) Patent No.: US 10,192,811 B2
(45) Date of Patent: Jan. 29, 2019

(54) POWER SEMICONDUCTOR DEVICE (71) Applicant: Mitsubishi Electric Corporation, Tokyo (JP)

(72) Inventors: Tatsuya Fukase, Tokyo (JP); Masaki Kato, Tokyo (JP); Masahiko Fujita, Tokyo (JP); Manabu Horita, Tokyo (JP)

(73) Assignee: Mitsubishi Electric Corporation, Chiyoda-ku, Tokyo (JP)

( * ) Notice: Subject to any disclaimer, the term of this patent is extended or adjusted under 35 U.S.C. 154(b) by 24 days.

(21) Appl. No.: 15/218,541

(22) Filed: Jul. 25, 2016

(65) Prior Publication Data

US 2017/0287819 A1 Oct. 5, 2017

(30) Foreign Application Priority Data

Apr. 4, 2016 (JP) ................................. 2016-074889

(51) Int. Cl.
*H01L 23/495* (2006.01)
*H01L 23/498* (2006.01)
(Continued)

(52) U.S. Cl.
CPC .... *H01L 23/49568* (2013.01); *H01L 23/3107* (2013.01); *H01L 23/36* (2013.01);
(Continued)

(58) Field of Classification Search
CPC .......... H01L 23/49568; H01L 23/4951; H01L 23/49513; H01L 23/4952; H01L 23/49575;
(Continued)

(56) References Cited

U.S. PATENT DOCUMENTS 5,451,813 A * 9/1995 Kazutaka ............ H01L 21/4842
257/666
5,652,184 A * 7/1997 Goto ....................... H01L 23/16
257/E23.034

(Continued)

FOREIGN PATENT DOCUMENTS

EP 2590309 A1 5/2013
JP 4030930 B2 1/2008
(Continued)

OTHER PUBLICATIONS

NPL Machine Translation 2013-98425.*
Communication dated Mar. 28, 2017, from the Japanese Patent Office in counterpart application No. 2016-074889.

*Primary Examiner* — Mohsen Ahmadi
*Assistant Examiner* — Patricia Reddington
(74) *Attorney, Agent, or Firm* — Sughrue Mion, PLLC; Richard C. Turner (57) ABSTRACT

When a power semiconductor device is energized, heat generated from upper-side power semiconductor chips mounted on a P-potential electrode transfers to a first heat mass portion and a second heat mass portion, and heat generated from lower-side power semiconductor chips mounted on a intermediate potential electrode transfers to a resistor. A lead frame, the power semiconductor chip, an inner lead and the resistor are placed in symmetry with respect to a centerline, which can reduce the difference among the temperature increases of the power semiconductor chips when energized. In this way, transient temperature increase of the power semiconductor chip can be suppressed without adding a new member, such as a heat diffusion plate.

18 Claims, 4 Drawing Sheets

(51) Int. Cl.
*H01L 23/31* (2006.01)
*H01L 23/36* (2006.01)

(52) U.S. Cl.
CPC ...... *H01L 23/4951* (2013.01); *H01L 23/4952* (2013.01); *H01L 23/49513* (2013.01); *H01L 23/49524* (2013.01); *H01L 23/49541* (2013.01); *H01L 23/49548* (2013.01); *H01L 23/49562* (2013.01); *H01L 23/49575* (2013.01); *H01L 23/49582* (2013.01); *H01L 23/49805* (2013.01); *H01L 2224/00* (2013.01); *H01L 2224/40245* (2013.01); *H01L 2924/00* (2013.01); *H01L 2924/181* (2013.01)

(58) Field of Classification Search
CPC ......... H01L 23/49582; H01L 23/49805; H01L 25/07; H01L 23/16; H01L 2924/1305–2924/13055; H01L 23/5951; H01L 2924/00; H01L 2224/00
USPC ....................................................... 257/675
See application file for complete search history.

(56) References Cited

U.S. PATENT DOCUMENTS

| | | | |
|---|---|---|---|
| 6,933,593 B2* | 8/2005 | Fissore | H01L 23/49861 257/666 |
| 2015/0162808 A1 | 6/2015 | Kato et al. | |
| 2016/0138548 A1* | 5/2016 | Gronwald | F02N 11/087 307/10.1 |
| 2016/0293530 A1* | 10/2016 | Shinohara | H01L 25/07 |
| 2017/0263529 A1* | 9/2017 | Viswanathan | H01L 23/3736 |

FOREIGN PATENT DOCUMENTS

| | | |
|---|---|---|
| JP | 2013098425 A | 5/2013 |
| JP | 2015095486 A | 5/2015 |
| JP | 2015115966 A | 6/2015 |

* cited by examiner

POWER SEMICONDUCTOR DEVICE

BACKGROUND OF THE INVENTION

Field of the Invention

The present invention relates to a power semiconductor device with a switchable power semiconductor chip mounted on a lead frame.

Description of the Background Art

A power semiconductor device is configured by mounting a switchable power semiconductor chip on a mount surface of a lead frame shaped in a wiring pattern and sealing them with a mold resin. The power semiconductor device is used as a single unit or a plurality of units in combination in a power conversion circuit that is incorporated into various products including transportation equipment and home electrical appliances.

When energized, the power semiconductor chip generates heat so that a temperature increases. Then, a current flowing in the power semiconductor chip needs to be controlled so that the temperature will not exceed a predetermined allowable temperature. Specifically, suppressing transient temperature increase of the power semiconductor chip when energized allows current flowing in the power semiconductor chip to be increased, which improves the performance of the power conversion circuit.

For in-car equipment, the performance of the power conversion circuit affects the amount of torque for driving a motor or power generated by a motor. In such equipment, a large amount of current that reaches several hundred amperes in a short time may flow. Then, suppressing transient temperature increase of the power semiconductor chip when a large amount of current flows therein is one of the most important factors for causing the product to operate.

As one structure for suppressing temperature increase of the power semiconductor chip, for example, PTL 1 presents a semiconductor power module in which a metallized surface of a semiconductor chip is soldered to a heat diffusion plate. In this example, a heat diffusion plate formed of a sintered compact containing copper and a copper plate is used to improve the heat dissipation capability of the semiconductor power module at a cost lower than that at which a high heat-conductivity ceramic substrate is used.

[PTL 1] Japanese Patent No. 4,030,930

However, in the structure presented in PTL 1 in which the heat diffusion plate is provided under the semiconductor chip, a variation in the thickness of the solder junction on the top and bottom sides of the heat diffusion plate causes a variation in the height of the semiconductor chip, increasing the variation in thermal resistance. In order to prevent trouble or failure in use, product design needs to be based on the thermal resistance at a place in which variation in height is highest, which poses a problem of limiting the performance of the product.

Furthermore, providing the heat diffusion plate poses a problem of increasing the material cost and the module size. Furthermore, the solder junction on the top and bottom sides of the heat diffusion plate serves as a passage through which current flows. Then, variation in the shape of the solder junction needs to be suppressed, which causes a problem of decreasing the productivity.

SUMMARY OF THE INVENTION

In order to solve the above problem, it is an object of the present invention to provide a power semiconductor device that can suppress transient temperature increase of a power semiconductor chip when energized, without increasing material cost and device size.

The power semiconductor device according to the invention includes: a metallic lead frame that has main surfaces opposite to each other, one of which being a mounting surface and the other of which being a dissipating surface, and including a P-potential electrode, intermediate potential electrodes, and an N-potential electrode, which are electrically independent; a switchable power semiconductor chip and a current detection resistor joined to the mounting surface of the lead frame via a conductive joining member; a wiring member that connects an electrode of the power semiconductor chip to a portion of the lead frame; and a resin that covers a portion of the mounting surface of the lead frame, the power semiconductor chip, the resistor and the wiring member, wherein the P-potential electrode includes: a chip mounting portion in which the mounting surface with two or more of the power semiconductor chips joined thereto is placed within the resin; and a first heat mass portion that is provided adjacent to the chip mounting portion and placed external to the resin.

According to the invention, heat generated from the power semiconductor chip joined to the P-potential electrode transfers to the first heat mass portion, which can provide the power semiconductor device that can suppress transient temperature increase of the power semiconductor chip when energized, without increasing the material cost and device size.

The foregoing and other objects, features, aspects and advantages of the present invention will become more apparent from the following detailed description of the present invention when taken in conjunction with the accompanying drawings.

DETAILED DESCRIPTION OF THE PREFERRED EMBODIMENTS (First Embodiment)

Figure 1:
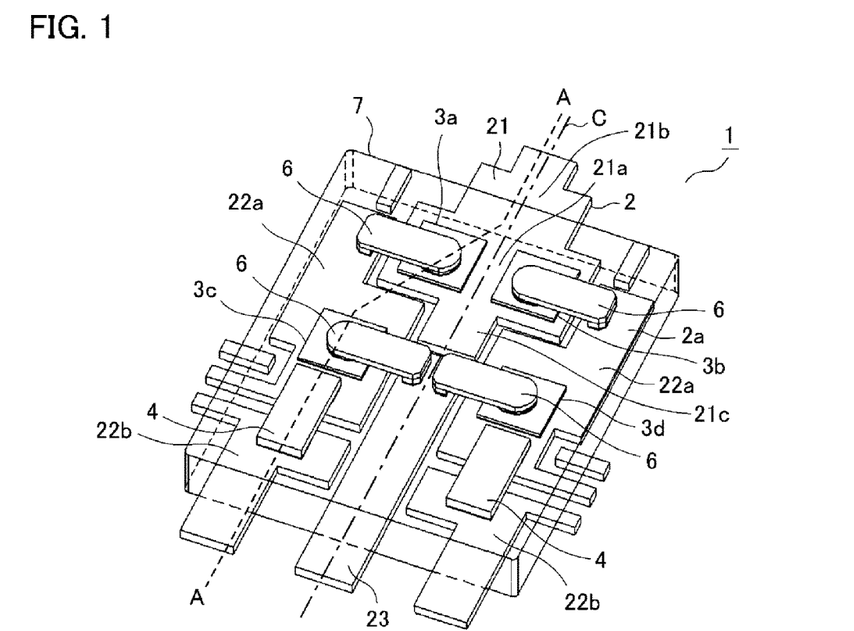
FIG. 1 is an internal perspective schematic view of a power semiconductor device according to a first embodiment of the invention.
Figure 2:
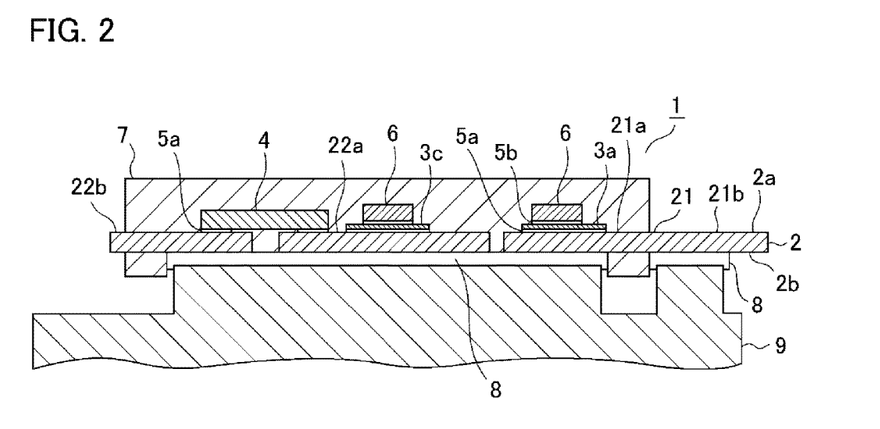
FIG. 2 is a cross-sectional view of the power semiconductor device according to the first embodiment of the invention.
Figure 3:
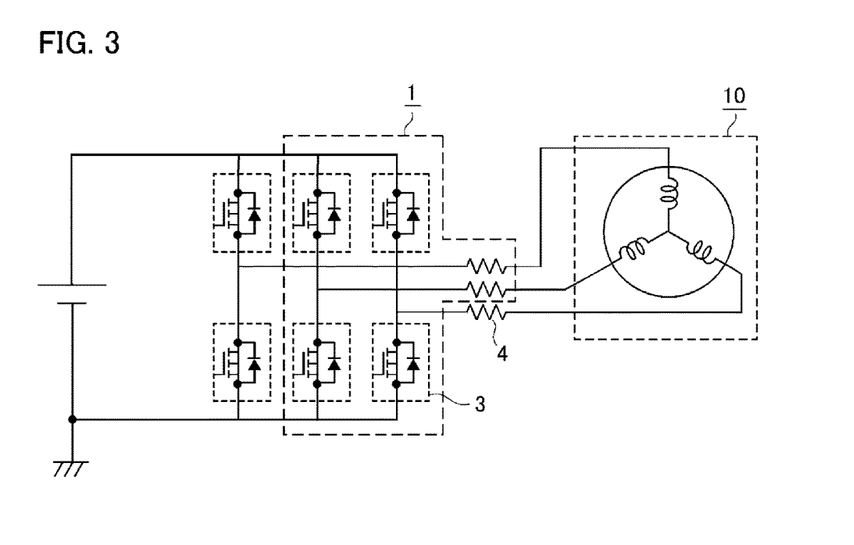
FIG. 3 is an equivalent circuit diagram of a power conversion circuit including the power semiconductor device according to the first embodiment of the invention.

A power semiconductor device according to a first embodiment of the invention is described below with reference to the drawings. FIG. 1 is an internal perspective schematic view of the power semiconductor device according to the first embodiment. FIG. 2 is a cross-sectional partial view taken along the line A-A in FIG. 1. FIG. 3 is an equivalent circuit diagram of a power conversion circuit including the power semiconductor device according to the first embodiment. Note that, through the drawings, the same or corresponding components are denoted by the same reference numerals.

A power semiconductor device 1 according to the first embodiment includes: a metallic lead frame 2 shaped in a wiring pattern; switchable upper-side power semiconductor chips 3a, 3b and lower-side power semiconductor chips 3c, 3d (collectively referred to as a power semiconductor chip 3); a current detection resistor 4; conductive joining members 5a, 5b, such as solder; a metallic inner lead 6 as a wiring member; and a mold resin 7 that is a resin covering the above components.

The lead frame 2 includes main surfaces opposite to each other, one of which is a mounting surface 2a and the other of which is a dissipating surface 2b. The lead frame 2 includes a P-potential electrode 21, intermediate potential electrodes 22a, 22b, and an N-potential electrode 23, which are electrically independent. The power semiconductor chip 3 and the current detection resistor 4 are joined to the mounting surface 2a of the lead frame 2 via the conductive joining member 5a.

The power semiconductor device 1 includes: the two upper-side power semiconductor chips 3a, 3b for a three-phase alternating current circuit on the P-potential electrode 21 and the lower-side power semiconductor chips 3c, 3d for the three-phase alternating current circuit on the two intermediate potential electrodes 22a (a first intermediate potential electrode), respectively. This forms two phases of the three-phase alternating current circuit, as shown in FIG. 3. Using three of the power semiconductor devices 1 can form a six-phase power conversion circuit or a power conversion circuit including two three-phase alternating current circuits in parallel.

As shown in FIG. 1, in the power semiconductor device 1, the P-potential electrode 21 and the N-potential electrode 23 are placed on one centerline C of the lead frame 2, and the lead frame 2, the power semiconductor chip 3, the inner lead 6 and the resistor 4 are placed in symmetry with respect to the centerline C.

This causes the heat capacity and temperature distribution within the power semiconductor device 1 to be in symmetry with respect to the centerline C. Especially, placing a plurality of the power semiconductor chips 3 in symmetry with respect to the centerline C can reduce the temperature difference among the power semiconductor chips 3. A current flowing in the power semiconductor device 1 is set so that the temperature of a power semiconductor chip 3 that heats up to the highest temperature will not exceed the allowable value. Then, by reducing the temperature difference among the power semiconductor chips 3, the allowable value of the output power of the power semiconductor device 1 increases.

The P-potential electrode 21 includes: a chip mounting portion 21a in which the mounting surface 2a with the two upper-side power semiconductor chips 3a, 3b joined thereto is placed within the mold resin 7; and a first heat mass portion 21b that is provided adjacent to the chip mounting portion 21a and placed external to the mold resin 7. Furthermore, the P-potential electrode 21 includes a second heat mass portion 21c opposite to the first heat mass portion 21b with the chip mounting portion 21a in between, and the mounting surface 2a of the second heat mass portion 21c is placed within the mold resin 7.

As shown in FIG. 2, the dissipating surface 2b of the lead frame 2 is connected to a heat sink 9 via an insulating adhesive 8 that is an insulating joining member. The insulating adhesive 8 contains ceramic filler having high heat conductivity. This secures the power semiconductor device 1 while achieving both insulation and dissipation capabilities. Also, the first heat mass portion 21b and the second heat mass portion 21c are similarly connected to the heat sink 9 via the insulating adhesive 8.

In this way, providing the second heat mass portion 21c within the mold resin 7 in addition to the first heat mass portion 21b placed external to the mold resin 7 improves the effect of suppressing transient temperature increase of the upper-side power semiconductor chips 3a, 3b mounted on the chip mounting portion 21a of the P-potential electrode 21 when energized.

Also, the temperature distribution of the power semiconductor chip 3 when transient temperature increase occurs is such that the temperature at the side of the power semiconductor chip 3 near the heat mass portions is low when no external influence exists. Then, providing the first heat mass portion 21b and the second heat mass portion 21c with the chip mounting portion 21a in between can prevent a bias of the temperature distribution of the upper-side power semiconductor chips 3a, 3b.

Note that the mounting surface 2a of the first heat mass portion 21b and the second heat mass portion 21c desirably has an area of 20 mm$^2$ or more. This secures an enough area for transferring heat to the heat sink 9 via the insulating adhesive 8, which provides the effect of suppressing a transient temperature increase when energized and the effect of constantly reducing heat resistance.

On the other hand, for the lower-side power semiconductor chips 3c, 3d mounted on the intermediate potential electrode 22a, the current detection resistor 4 functions as a heat mass portion. The metallic resistor 4, such as a shunt resistor, is joined to an electrode on the lead frame 2 via the conductive joining member 5a, and placed between the power semiconductor device 1 and a motor 10, as shown in FIG. 3.

The intermediate potential electrode 22a is electrically connected to the intermediate potential electrode 22b (a second intermediate potential electrode) by the metallic resistor 4. The intermediate potential electrode 22b does not have the power semiconductor chip 3 mounted thereon and is connected to an external electrode. The resistor 4 is described later in detail.

The resistor 4 is mounted near the lower-side power semiconductor chips 3c, 3d mounted on the intermediate potential electrode 22a and acts as a heat mass for heat generated from the lower-side power semiconductor chips 3c, 3d. This reduces the temperature difference between the upper-side power semiconductor chips 3a, 3b mounted on the P-potential electrode 21 and the lower-side power semiconductor chips 3c, 3d mounted on the intermediate potential electrode 22a.

Furthermore, the metallic inner lead 6 used as a wiring member acts as a heat mass for heat generated from the power semiconductor chip 3, which further improves the effect of suppressing temperature increase of the power semiconductor chip 3. The inner lead 6 is in contact with the mold resin 7 except the portion that is connected to the electrodes via the conductive joining member 5b. The mold resin 7 contains insulating filler to transfer heat generated from the power semiconductor chip 3 to the outside.

A manufacturing method, construction material, dimension and the like of the power semiconductor device 1 according to the first embodiment is described below with reference to an example. The lead frame 2 is made by etching and pressing an alloy plate containing copper or aluminum or the like as a base material and shaping the plate in a wiring pattern. On the surface of the lead frame, the material metal may be exposed or may be partially plated.

The power semiconductor chip 3 and the resistor 4 are mounted on the mounting surface 2a of the lead frame 2, then covered with the mold resin 7 by transfer molding, and then, an unwanted part of the lead frame 2 is cut off. This forms the P-potential electrode 21, the intermediate potential electrodes 22a, 22b and the N-potential electrode 23.

The lead frame 2 desirably has a thickness of 0.4 mm or more. Using the lead frame 2 with a thickness of 0.4 mm or more causes heat to be efficiently transferred to the first heat mass portion 21b, providing the effect of suppressing transient temperature increase of the upper-side power semiconductor chips 3a, 3b.

The power semiconductor chip 3 is a metal-oxide semiconductor field-effect transistor (MOSFET), an insulated gate bipolar transistor (IGBT) or the like, for example. The base material of the power semiconductor chip 3 is Si, SiC, SiN, GaN, GaAs or the like.

The power semiconductor chip 3 includes a top surface electrode, a gate portion and a gate electrode on the top surface of the chip and a bottom surface electrode on the bottom surface of the chip, all of which are not shown. The gate electrode is electrically connected to a gate terminal formed of a portion of the lead frame 2 by a wire bond (not shown). The top surface electrode is connected to an electrode on the lead frame 2 by the inner lead 6. When the top surface electrode is joined to the inner lead 6 by soldering, the top surface electrode is soldering-enabled by Ni plating.

The resistor 4 has both end portions made of an alloy containing copper as a base material and a midportion that is a metallic resistor body having a heat conductivity of 20 W/m·k or higher. A base material having a large heat capacity and high heat conductivity is used for the both end portions of the resistor 4, which improves heat mass function. Furthermore, the midportion resistor body of the resistor 4 is made of a high heat-conductivity metal, which allows heat generated from the lower-side power semiconductor chips 3c, 3d mounted on the intermediate potential electrode 22a to be efficiently transferred to the intermediate potential electrode 22b through the resistor 4.

When solder is used as the conductive joining members 5a, 5b, the top surface electrode of the power semiconductor chip 3 is joined to the inner lead 6, the bottom surface electrode is joined to the lead frame 2, and the resistor 4 is joined to the lead frame 2 at the same time through heat treatment using a reflow apparatus. Note that, if a difference in durability of the solder junctions occurs because of a distortion due to temperature change when the power semiconductor device 1 is used, a solder having a different composition may also be used for each solder junction.

The body of the inner lead 6 is deformed so as to be away from the lead frame 2 in order to prevent short circuit to the lead frame 2. The cross-sectional area of the body of the inner lead 6 is determined depending on the amount of current flowing therethrough. The power semiconductor device 1 according to the first embodiment allows for current from several amperes to several hundred amperes or so including instantaneously applied current flowing therethrough.

The inner lead 6 has a thickness of 0.5 mm or more at a minimum, which provides the effect of suppressing transient temperature increase of the power semiconductor chip 3 and can secure the rigidity of the inner lead 6 to prevent a failure due to deformation of the inner lead 6.

Using a plurality of the inner leads 6 having the same shape and size provides a heat mass with the same heat capacity onto all of the power semiconductor chips 3, which can reduce the temperature difference among the power semiconductor chips 3.

Alternatively, the minimum thickness value of the inner lead 6 connected to the upper-side power semiconductor chips 3a, 3b mounted on the P-potential electrode 21 may be at least different from the minimum thickness value of the inner lead 6 connected to the lower-side power semiconductor chips 3c, 3d mounted on the intermediate potential electrode 22a.

Specifically, as for the upper-side power semiconductor chips 3a, 3b mounted on the P-potential electrode 21, the first heat mass portion 21b and the second heat mass portion 21c suppress temperature increase, whereas, as for the lower-side power semiconductor chips 3c, 3d mounted on the intermediate potential electrode 22a, only the resistor 4 operates as a heat mass. As such, increasing the heat capacity of the inner lead 6 connected to the lower-side power semiconductor chips 3c, 3d to improve its heat mass function can reduce the temperature difference among the power semiconductor chips 3.

Note that, in the first embodiment, the two upper-side power semiconductor chips 3a, 3b are mounted on the P-potential electrode 21 and the lower-side power semiconductor chips 3c, 3d are mounted on the two intermediate potential electrodes 22a, respectively, however, the number and placement of the power semiconductor chip 3 is not limited to this. Two or more power semiconductor chips 3 may be mounted on the P-potential electrode 21. Furthermore, the invention can also be applied to a power semiconductor device that forms one or three phases of the three-phase alternating current circuit.

The conductive joining member 5a, 5b are not limited to the solder, and an electrically conductive resin paste, a sintering paste or the like may also be used. Furthermore, the wiring member is not limited to the inner lead 6, but a wire bond, a ribbon bond or the like made of copper, aluminum, copper-aluminum clad material or the like may also be used.

As described above, according to the first embodiment, when the power semiconductor device 1 is energized, heat generated from the upper-side power semiconductor chips 3a, 3b mounted on the P-potential electrode 21 transfers to the first heat mass portion 21b and the second heat mass portion 21c. Also, heat generated from the lower-side power semiconductor chips 3c, 3d mounted on the intermediate potential electrode 22a transfers to the resistor 4.

In this way, transient temperature increase of the power semiconductor chip 3 can be suppressed without adding a new member, such as a heat diffusion plate, under the power semiconductor chip 3 and increasing the material cost and device size.

Furthermore, the lead frame 2, the power semiconductor chip 3, the inner lead 6 and the resistor 4 are placed in symmetry with respect to the centerline C, causing the heat capacity and temperature distribution within the power semiconductor device 1 to be in symmetry with respect to the centerline C, which can reduce the difference among the temperature increases of the power semiconductor chips 3 when energized.

Then, a large amount of current flowing in a short time can be handled without increasing the size of the power semiconductor chip 3, which improves the performance of the product. Furthermore, the power semiconductor device 1 has good inner weight balance, which reduces defects and mishandling in transporting in the manufacturing process, improving the manufacturing yield.

Note that a plurality of the power semiconductor devices 1 according to the first embodiment in combination forms a power conversion circuit for a motor generator. The motor generator is a product having both the starting function of a starter and the power generating function of an alternator, in which a large amount of current flows in a short time, such as when an engine is started. According to the first embodiment, transient temperature increase of the power semiconductor chip 3 when the large amount of current flows therein can be suppressed, which increases the amount of current that can flow in the power semiconductor device 1, thereby allowing the torque output from the motor and the amount of generated power to be increased.

(Second Embodiment)

Figure 4:
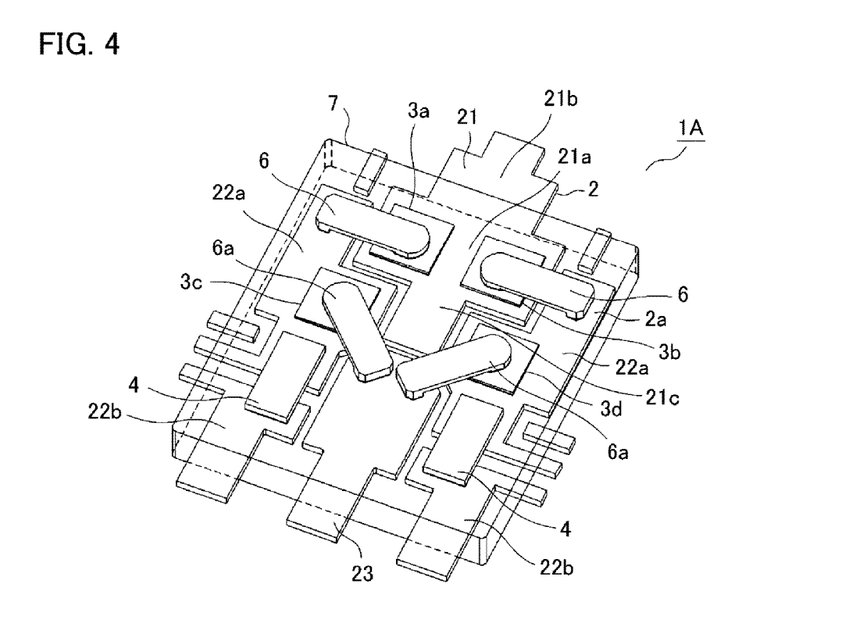
FIG. 4 is an internal perspective schematic view of a power semiconductor device according to a second embodiment of the invention.

FIG. 4 is an internal perspective schematic view of a power semiconductor device according to a second embodiment of the invention. In a power semiconductor device 1A according to the second embodiment, the lower-side power semiconductor chips 3c, 3d mounted on the first intermediate potential electrode 22a are connected to the N-potential electrode 23 by an inner lead 6a that is placed diagonally with respect to the centerline C of the lead frame 2 (see FIG. 1). The remaining parts are configured in the same way as the first embodiment with their description omitted.

In the power semiconductor device 1A, the lower-side power semiconductor chips 3c, 3d joined to the first intermediate potential electrode 22a, the N-potential electrode 23, and the inner lead 6a connecting them have each respective circular joining surface pad (not shown). This allows the inner lead 6a to be placed diagonally with respect to the lower-side power semiconductor chips 3c, 3d.

With this configuration, even when the second heat mass portion 21c is provided to the P-potential electrode 21, the first intermediate potential electrode 22a need not be extended by a corresponding length, and the lower-side power semiconductor chips 3c, 3d mounted on the first intermediate potential electrode 22a can be connected to the N-potential electrode 23. Thus, according to the second embodiment, the device size can be reduced in addition to the same effect as that of the first embodiment.

(Third Embodiment)

Figure 5:
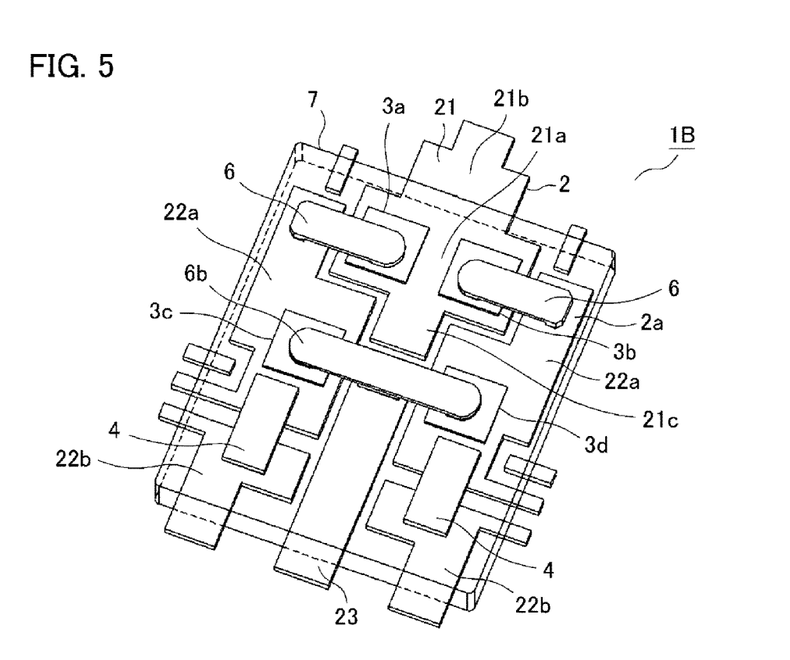
FIG. 5 is an internal perspective schematic view of a power semiconductor device according to a third embodiment of the invention.

FIG. 5 is an internal perspective schematic view of a power semiconductor device according to a third embodiment of the invention. In a power semiconductor device 1B according to the third embodiment, the lower-side power semiconductor chips 3c, 3d joined to the first intermediate potential electrodes 22a, respectively, and the N-potential electrode 23 are connected by one straight inner lead 6b. The remaining parts are configured in the same way as the first embodiment with their description omitted.

The lower-side power semiconductor chips 3c, 3d mounted on the first intermediate potential electrodes 22a, respectively, can be connected by the one straight inner lead 6b with half the workload of using two inner leads, which improves the productivity. Furthermore, the inner lead 6b is fixed at three points, which reduces positional misalignment between the lower-side power semiconductor chips 3c, 3d mounted on the first intermediate potential electrodes 22a and the inner lead 6b.

Furthermore, positional misalignment in the rotation direction of the inner lead 6b around the intermediate connected to the N-potential electrode 23 can be suppressed. Thus, according to the third embodiment, the productivity can be improved in addition to the same effect as that of the first embodiment.

(Fourth Embodiment)

Figure 6:
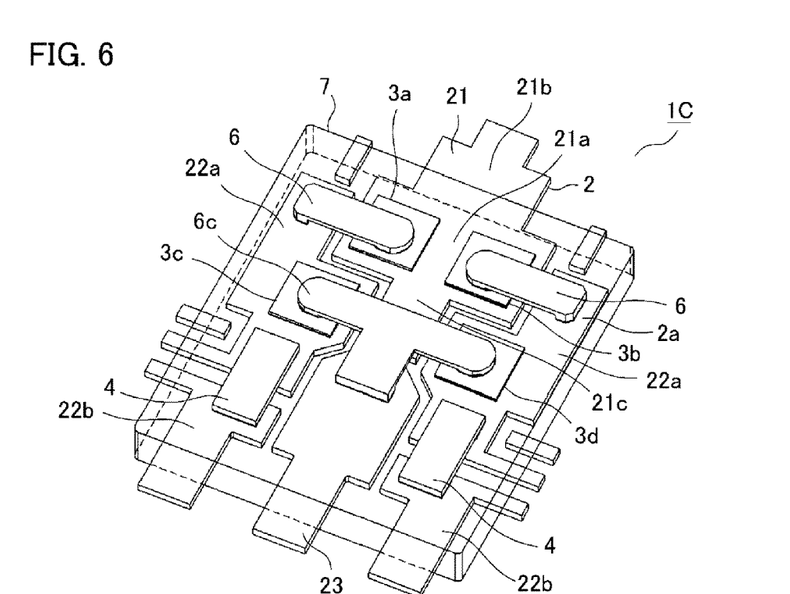
FIG. 6 is an internal perspective schematic view of a power semiconductor device according to a fourth embodiment of the invention.

FIG. 6 is an internal perspective schematic view of a power semiconductor device according to a fourth embodiment of the invention. In a power semiconductor device 1C according to the fourth embodiment, the lower-side power semiconductor chips 3c, 3d joined to the first intermediate potential electrodes 22a, respectively, and the N-potential electrode 23 are connected by one T-shaped inner lead 6c. The remaining parts are configured in the same way as the first embodiment with their description omitted.

The lower-side power semiconductor chips 3c, 3d mounted on the first intermediate potential electrodes 22a, respectively, can be connected by the one T-shaped inner lead 6c with half the workload of using two inner leads, which improves the productivity. Furthermore, even when the second heat mass portion 21c is provided to the P-potential electrode 21, the first intermediate potential electrode 22a need not be extended by a corresponding length, and the lower-side power semiconductor chips 3c, 3d mounted on the first intermediate potential electrode 22a can be connected to the N-potential electrode 23.

Furthermore, the T-shaped inner lead 6c has a heat capacity larger than that of the straight inner lead, which improves the effect of reducing the transient temperature increase of the lower-side power semiconductor chips 3c, 3d. Thus, according to the forth embodiment, the device size can be reduced and the productivity can be improved in addition to the same effect as that of the first embodiment.

(Fifth Embodiment)

Figure 7:
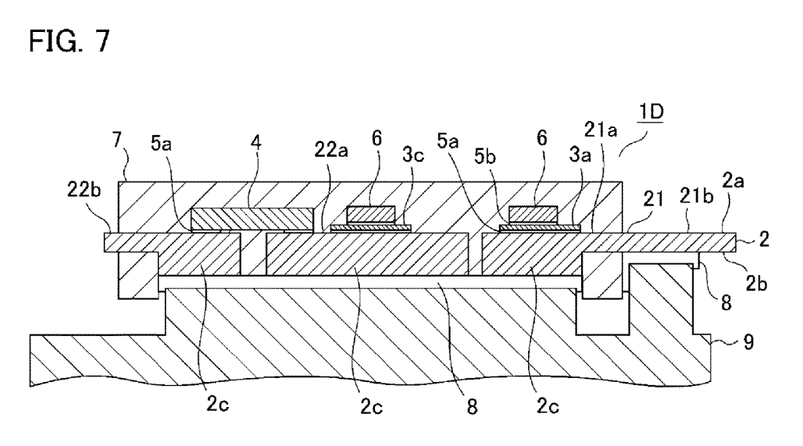
FIG. 7 is a cross-sectional view of a power semiconductor device according to a fifth embodiment of the invention.

FIG. 7 is a cross-sectional view of a power semiconductor device according to a fifth embodiment of the invention. In a power semiconductor device 1D according to the fifth embodiment, the lead frame 2 has two portions having a different thickness, and the power semiconductor chip 3 is joined to a thick-walled portion 2c having a larger thickness. The remaining parts are configured in the same way as the first embodiment with their description omitted.

The power semiconductor chip 3 is mounted on the thick-walled portion 2c of the lead frame 2, which further improves the effect of reducing the transient temperature increase of the power semiconductor chip 3. Furthermore, some portion of the lead frame 2 is thicker than other portion, which improves the rigidity of the lead frame 2 to make the lead frame 2 less deformable.

According to the fifth embodiment, the manufacturing yield can be improved in addition to the same effect as that of the first embodiment. According to the invention, the embodiments may be freely combined or the embodiments may be appropriately modified or omitted within the scope of the invention.

Various modifications and alterations of this invention will be apparent to those skilled in the art without departing from the scope and spirit of this invention, and it should be understood that this is not limited to the illustrative embodiments set forth herein.

What is claimed is:

1. A power semiconductor device comprising:
   a metallic lead frame that includes a mounting surface and a dissipating surface opposite to the mounting surface, and including a P-potential electrode, intermediate potential electrodes, and an N-potential electrode that are electrically independent;
   power semiconductor chips and a current detection resistor that are disposed on the mounting surface of the metallic lead frame via conductive joining members;

a wiring member that connects an electrode of one of the power semiconductor chips to a portion of the metallic lead frame; and a resin that covers a portion of the mounting surface of the metallic lead frame, the power semiconductor chips, the current detection resistor and the wiring member, wherein the P-potential electrode and the N-potential electrode are disposed on a centerline of the metallic lead frame, and the metallic lead frame, the power semiconductor chips, the wiring member and the current detection resistor are disposed in symmetry with respect to the centerline.

2. The power semiconductor device according to claim 1, wherein the P-potential electrode includes:

a chip mounting portion on which two or more of the power semiconductor chips are disposed, the chip mounting portion being disposed within the resin; and a first heat mass portion that is disposed adjacent to the chip mounting portion and disposed external to the resin.

3. The power semiconductor device according to claim 2, wherein the dissipating surface of the metallic lead frame is joined to a heat sink via an insulating joining member, and the first heat mass portion is joined to the heat sink via the insulating joining member.

4. The power semiconductor device according to claim 2, wherein the P-potential electrode includes a second heat mass portion opposite to the first heat mass portion, the chip mounting portion interposed between the first heat mass portion and the second heat mass portion, and the mounting surface of the second heat mass portion is disposed within the resin.

5. The power semiconductor device according to claim 4, wherein the dissipating surface of the metallic lead frame is joined to a heat sink via an insulating joining member, and the second heat mass portion is joined to the heat sink via the insulating joining member.

6. The power semiconductor device according to claim 4, wherein the mounting surface of the second heat mass portion has an area of 20 $mm^2$ or more.

7. The power semiconductor device according to claim 2, wherein the mounting surface of the first heat mass portion has an area of 20 $mm^2$ or more.

8. The power semiconductor device according to claim 2, wherein the power semiconductor chips include:

two upper-side power semiconductor chips for a three-phase alternating current circuit, the two upper-side power semiconductor chips being disposed on the chip mounting portion of the P-potential electrode; and two lower-side power semiconductor chips for the three-phase alternating current circuit, the two lower-side power semiconductor chips being disposed on the intermediate potential electrodes, respectively, and the power semiconductor chips form two phases of the three-phase alternating current circuit.

9. The power semiconductor device according to claim 1, wherein the intermediate potential electrodes include:

two first intermediate potential electrodes on which two of the power semiconductor chips are respectively disposed; and two second intermediate potential electrodes on which the power semiconductor chips are not disposed, the two second intermediate potential electrodes being physically separate from the two first intermediate potential electrodes, and one of the two first intermediate potential electrodes is electrically connected to one of the second intermediate potential electrodes by the current detection resistor.

10. The power semiconductor device according to claim 9, wherein the wiring member comprises a T-shaped metallic inner lead, and the two of the power semiconductor chips respectively disposed on the two first intermediate potential electrodes are connected to the N-potential electrode by the T-shaped metallic inner lead.

11. The power semiconductor device according to claim 9, wherein the wiring member comprises a straight metallic inner lead, and the two of the power semiconductor chips respectively disposed on the two first intermediate potential electrodes are connected to the N-potential electrode by the straight metallic inner lead.

12. The power semiconductor device according to claim 1, wherein the wiring member comprises a metallic inner lead having a thickness of 0.5 mm or more.

13. The power semiconductor device according to claim 1, further comprising a metallic inner lead that connects another electrode of another one of the power semiconductor chips to another portion of the metallic lead frame, the metallic inner lead having a same shape and a same size as the wiring member.

14. The power semiconductor device according to claim 1, wherein the wiring member comprises a first metallic inner lead having a first minimum thickness value, and connected to one of the power semiconductor chips disposed on the P-potential electrode, and the power semiconductor device further comprises a second metallic inner lead having a second minimum thickness value different than the first minimum thickness value, and connected to one of the power semiconductor chips disposed on one of the intermediate potential electrodes.

15. The power semiconductor device according to claim 1, wherein the intermediate potential electrodes include:

two first intermediate potential electrodes on which two of the power semiconductor chips are respectively disposed; and two second intermediate potential electrodes on which the power semiconductor chips are not disposed, the two second intermediate potential electrodes being physically separate from the two first intermediate potential eletrodes, the wiring member comprises a metallic inner lead, the two of the power semiconductor chips respectively disposed on the two first intermediate potential electrodes are connected to the N-potential electrode by the metallic inner lead, each of the two of the power semiconductor chips respectively disposed on the two first intermediate potential electrodes, the N-potential electrode, and the metallic inner lead include a circular joining surface pad, and the metallic inner lead is disposed diagonally with respect to the centerline.

16. The power semiconductor device according to claim 1, wherein the metallic lead frame has a thickness of 0.4 mm or more.

17. The power semiconductor device according to claim 1, wherein the metallic lead frame includes two portions having different thicknesses, and the power semiconductor chips are disposed on one of the two portions having a larger thickness.

18. The power semiconductor device according to claim 1, wherein the current detection resistor includes end portions made of an alloy containing copper as a base material, and a midportion that is a metallic resistor body having a heat conductivity of 20 W/mK or higher.

\* \* \* \* \*